US009224479B1

(12) United States Patent
Bates et al.

(10) Patent No.: US 9,224,479 B1
(45) Date of Patent: Dec. 29, 2015

(54) THRESHOLD VOLTAGE ADJUSTMENT IN SOLID STATE MEMORY

(71) Applicant: PMC-Sierra US, Inc., Sunnyvale, CA (US)

(72) Inventors: Stephen Bates, Canmore (CA); Ognjen Katic, Vancouver (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 93 days.

(21) Appl. No.: 14/132,229

(22) Filed: Dec. 18, 2013

(51) Int. Cl.
*G11C 16/10* (2006.01)
*G11C 11/56* (2006.01)
*G11C 16/04* (2006.01)

(52) U.S. Cl.
CPC ............ *G11C 16/10* (2013.01); *G11C 11/5621* (2013.01); *G11C 11/5628* (2013.01); *G11C 11/5642* (2013.01); *G11C 16/0483* (2013.01)

(58) Field of Classification Search
CPC .... G11C 16/34; G11C 16/10; G11C 16/0483; G11C 11/5642; G11C 11/5628; G11C 11/5621
USPC .............. 365/185.03, 185.33, 185.01, 185.17
See application file for complete search history.

(56) References Cited

U.S. PATENT DOCUMENTS

| | | | |
|---|---|---|---|
| 6,961,742 B2 * | 11/2005 | Neretti et al. ................. | 708/300 |
| 8,484,519 B2 | 7/2013 | Weathers et al. | |
| 2010/0091535 A1 * | 4/2010 | Sommer et al. ................. | 365/45 |
| 2012/0213004 A1 | 8/2012 | Yun et al. | |
| 2012/0296900 A1 * | 11/2012 | Kalai et al. .................... | 707/737 |
| 2013/0047045 A1 | 2/2013 | Hu et al. | |
| 2013/0227374 A1 * | 8/2013 | Desireddi ...................... | 714/758 |
| 2014/0119113 A1 * | 5/2014 | Xia et al. ................. | 365/185.03 |

OTHER PUBLICATIONS

Shadley, Scott, NAND Flash Media Management Through RAIN, Technical Marketing Brief, copyright 2011, pp. 1-8, Micron Technology Inc., www.micron.com/ssd_rain_tech_brief.ashx, Boise, ID.
Raise™—Redundant Array of Independent Silicon Elements, LSI Logic Inc., printed on Oct. 24, 2013, http://www.lsi.com/technology/duraclass/Pages/RAISE.aspx.
RAID, (redundant array of independent disks, originally redundant array of inexpensive disks), printed on Oct. 24, 2013, pp. 1-8, Wikipeida, http://en.wikipedia.org/wiki/RAID.

* cited by examiner

*Primary Examiner* — Hoai V Ho
*Assistant Examiner* — Tri Hoang
(74) *Attorney, Agent, or Firm* — Dennis R. Haszko

(57) ABSTRACT

A method is disclosed for setting or modifying a threshold voltage in a NAND flash memory, using an optimization method and based on an error, such as stored in a threshold voltage table. In an embodiment, a method is provided to optimize the read voltage on a NAND flash memory in order to minimize the errors on the NAND flash memory in the fewest reads operations as possible. Advantageously, the method of the present disclosure is more reliability as the method minimizes a Raw Bit Error Rate (RBER) on the NAND flash memory. In an embodiment, a NAND controller adjusts an existing cell read threshold voltage for a selected cell, using an iterative optimization method, based on a difference between first and second error rates, or a difference between first and second probabilities, to generate an adjusted cell read threshold voltage.

18 Claims, 5 Drawing Sheets

THRESHOLD VOLTAGE ADJUSTMENT IN SOLID STATE MEMORY

FIELD

The present disclosure relates generally to the use of solid state memory. More particularly, the present disclosure relates to the adjustment of a threshold voltage, such as for a read operation, in a solid state memory.

BACKGROUND

Non-Volatile Memory (NVM) is very attractive because it permits the storage of data for some length of time. The ability to store data has enabled the information age and prompt, reliable access to this data is one of the reasons why Solid State Drives (SSDs) have become so popular in recent years. Also, Solid-state drives (SSDs) that are built using NAND flash memory are becoming more and more common as their price decreases.

In order to reduce the cost of NAND flash, there is a desire to move to smaller and smaller process geometries. However, as shown in FIG. 1, moving to smaller process geometries reduces the reliability of the NAND flash memory. In the graph 10 of FIG. 1, the error rate of NAND flash memory increases (i.e., gets worse) when moving from one process node to the next. In FIG. 1, the x-axis represents the Program Erase (PE) cycles and the y-axis represents the average Raw Bit Error Rate (RBER) per page.

NAND flash memory, however, is not particularly reliable as a storage medium because NAND flash memory often suffers from errors. Because NVMs are never error free, and to ensure data is reliably protected, a NVM controller must implement a robust error correction method. Error correction methods are currently migrating from classical Error Correction Codes (ECCs) to Low-Density Parity Check (LDPC) codes. LDPC codes are a stronger class of ECC and as such are capable of correcting more errors for the same amount of parity overhead. LDPC codes are more complex to implement in VLSI circuits, however, because of Moore's Law, the additional cost of utilizing LDPC codes in VLSI circuits is decreasing as NVM controllers are implemented in newer and smaller geometries.

A read error occurs in a NAND flash memory when the read state differs from the write state. Such read errors can be corrected by modifying or offsetting a voltage associated with a threshold between two bit states. Improvements in the setting or modifying of NAND flash memory read voltage thresholds are desirable.

BRIEF DESCRIPTION OF THE DRAWINGS

Embodiments of the present disclosure will now be described, by way of example only, with reference to the attached Figures.

DETAILED DESCRIPTION

Figure 1:
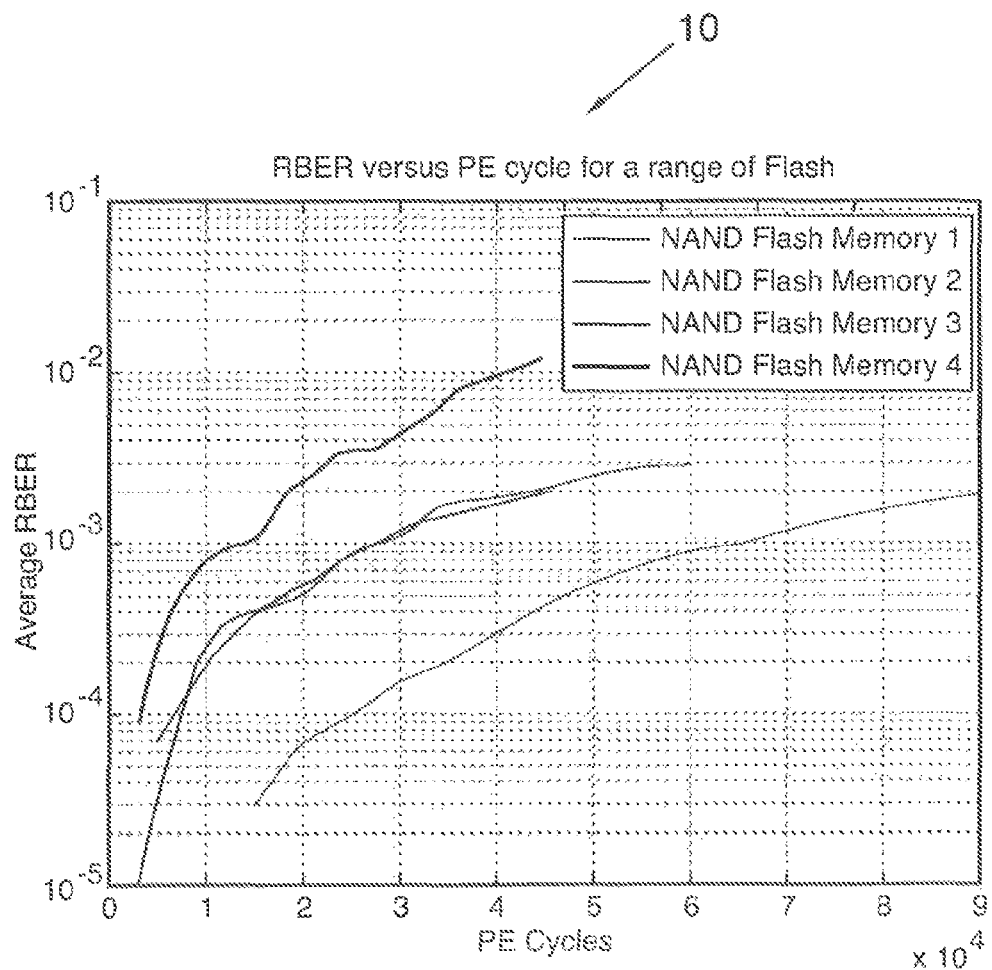
FIG. 1 is a graph illustrating NAND flash memory error rates as a function of Program Erase (PE) cycles.

Generally, the present disclosure provides a method for setting or modifying a threshold voltage in a NAND flash memory, using an optimization method and based on an error, such as stored in a threshold voltage table. In an embodiment, a method is provided to optimize the read voltage on a NAND flash memory in order to minimize the errors on the NAND flash memory in the fewest reads operations as possible. Advantageously, the method of the present disclosure is more reliability as the method minimizes a Raw Bit Error Rate (RBER) on the NAND flash memory. In an embodiment, a NAND controller adjusts an existing cell read threshold voltage for a selected cell, using an iterative optimization method, based on a difference between first and second error rates, or a difference between first and second probabilities, to generate an adjusted cell read threshold voltage.

In an embodiment, the present disclosure provides a controller-implemented method for adjusting a threshold voltage for a NAND flash memory having a plurality of cells. The method includes: a) obtaining, at a NAND flash memory controller, a first probability that a read state of a selected cell in the plurality of cells is different from a write state of the selected cell, the read state being a first bit value and the write state being a second bit value; b) obtaining, at the NAND flash memory controller, a second probability that the write state of the selected cell is the first bit value and the read state is the second bit value; c) providing, at the NAND flash memory controller, an error signal to an iterative optimization method, the error signal comprising a difference between the first and second probabilities; and d) adjusting, at the NAND flash memory controller and using the iterative optimization method, a cell read threshold voltage for the selected cell based on the difference between the first and second probabilities, to generate an adjusted cell read threshold voltage.

In an example embodiment, adjusting comprises adding, to the existing cell read threshold voltage, the difference between the first and second probabilities multiplied by a gain. In an example embodiment, the iterative optimization method utilizes a stochastic gradient descent. In such an embodiment, the stochastic gradient descent method generates the adjusted cell read threshold voltage. In another example embodiment, the iterative optimization method utilizes lattice adaptive filters.

In an example embodiment the method further comprises: determining, at the NAND flash memory controller and using an error correction code, the first probability that the read state of the selected cell in the plurality of cells is different from the write state of the selected cell. In an example embodiment, an error correction code circuit generates a signal that is provided to firmware of the controller to generate the first probability.

In an example embodiment, the method further comprises: determining, at the NAND flash memory controller and using an error correction code, the second probability that the write state of the selected cell is the first bit value and the read state is the second bit value. In an example embodiment, an error correction code circuit generates a signal that is provided to firmware of the controller to generate the second probability.

In an example embodiment, the iterative optimization method is configured to cooperate with an offset read function of the NAND flash memory controller to incorporate command sequences of the offset read into the iterative optimization method.

In an example embodiment, the selected cell is a multi-level cell having at least two cell read threshold voltages, and wherein the method further comprises repeating steps a) through d) for each cell read threshold voltage of the selected multi-level cell.

In an example embodiment, the method further comprises repeating steps a) through d) for each cell in the plurality of cells of the NAND flash memory. In an example embodiment, the method further comprises concurrently generating the adjusted cell read threshold voltages for a set of selected cells in the plurality of cells. In an example embodiment, in step c) for each cell in the plurality of cells, the difference between the first and second probabilities comprises an average of the first and second probabilities.

In an example embodiment, the method further comprises: repeating steps a) and b) for each cell in the plurality of cells; and generating a voltage transition matrix comprising the average of the first and second probabilities for each cell in the plurality of cells.

In an example embodiment, the method further comprises: reading, at the NAND flash memory controller, all pages in a block of the NAND flash memory; using an error correction code (ECC) at the NAND flash memory controller to determine error locations upon which the first and second probabilities are based; mapping, at the NAND flash memory controller, the error locations with respect to cell read threshold voltages; and accumulating, at the NAND flash memory controller, the error locations with respect to the cell read threshold voltages over the block and generating a voltage transition matrix.

In another embodiment, the present disclosure provides a controller-implemented method for adjusting a threshold voltage for a NAND flash memory having a plurality of cells. The method includes: a) obtaining, at a NAND controller, a first error rate representing when a read state of a selected cell in the plurality of cells is different from a write state of the selected cell, the read state being a first bit value and the write state being a second bit value; b) obtaining, at the NAND controller, a second error rate representing when the write state of the selected cell being the first bit value and the read state being the second bit value; c) providing, at the NAND controller, an error signal to an iterative optimization method, the error signal comprising a difference between the first and second error rates; and d) adjusting, at the NAND controller and using the iterative optimization method, a cell read threshold voltage for the selected cell such that the first error rate equals the second error rate.

In an example embodiment, the method further comprises: repeating steps a) and b) for each cell in the plurality of cells; and generating a voltage transition matrix comprising the average of the first and second error rates for each cell in the plurality of cells.

In an example embodiment, the method further comprises: reading, at the NAND flash memory controller, all pages in a block of the NAND flash memory; using an error correction code (ECC) at the NAND flash memory controller to determine error locations upon which the first and second error rates are based; mapping, at the NAND flash memory controller, the error locations with respect to cell read threshold voltages; and accumulating, at the NAND flash memory controller, the error locations with respect to the cell read threshold voltages over the block and generating a voltage transition matrix.

In a further embodiment, the present disclosure provides a non-transitory computer readable memory storing statements and instructions for execution by a NAND flash memory controller to perform a method for adjusting a threshold voltage for a NAND flash memory having a plurality of cells, the method comprising: a) obtaining, at the NAND controller, a first error rate representing when a read state of a selected cell in the plurality of cells is different from a write state of the selected cell, the read state being a first bit value and the write state being a second bit value; b) obtaining, at the NAND controller, a second error rate representing when the write state of the selected cell being the first bit value and the read state being the second bit value; c) providing, at the NAND controller, an error signal to an iterative optimization method, the error signal comprising a difference between the first and second error rates; and d) adjusting, at the NAND controller and using the iterative optimization method, an existing cell read threshold voltage for the selected cell such that the first error rate equals the second error rate.

Other aspects and features of the present disclosure will become apparent to those ordinarily skilled in the art upon review of the following description of specific embodiments in conjunction with the accompanying figures.

To address reliability issues in NAND flash memory, manufacturers are providing additional controls to help extend the life of the NAND flash memory. Offset reads, also referred to as $V_t$ adjusted reads, are one such control. According to an embodiment of the present disclosure, known offset read functionality, which often involves manual operations or trial and error, can be improved using optimization methods to extend the life of a Solid State Drive (SSD) built using NAND flash memory.

Embodiments of the present disclosure differ from existing solutions since currently, only crude "brute force" search methods exist for finding optimum offset read levels. Embodiments of the present disclosure also reduce a number of times a NAND flash memory needs to be read, hence minimizing latency.

Embodiments of the present disclosure are relevant to single level cell (SLC), multi-level cell (MLC-2) and triple level cell (TLC) NAND flash memory. Examples described herein will focus on MLC-2 flash memory, with suitable adaptations to other types of flash memory being within the scope of embodiments of the present disclosure.

In MLC-2 flash memory, each flash memory cell is programmed to one of four states. When the flash memory is read, internal circuitry of the flash memory determines which of the four states the memory cell is in and returns the associated bit(s). As NAND flash memory wears, after multiple read/write cycles and data retention, a shift in the distribution of charge on the floating gate appears, and this causes errors when reading. A read state is the state of the NAND flash memory, for example as determined during a read operation. A write state is the state of the NAND flash memory, for example as written during a write operation. An error occurs when the read state differs from the write state.

Figure 2:
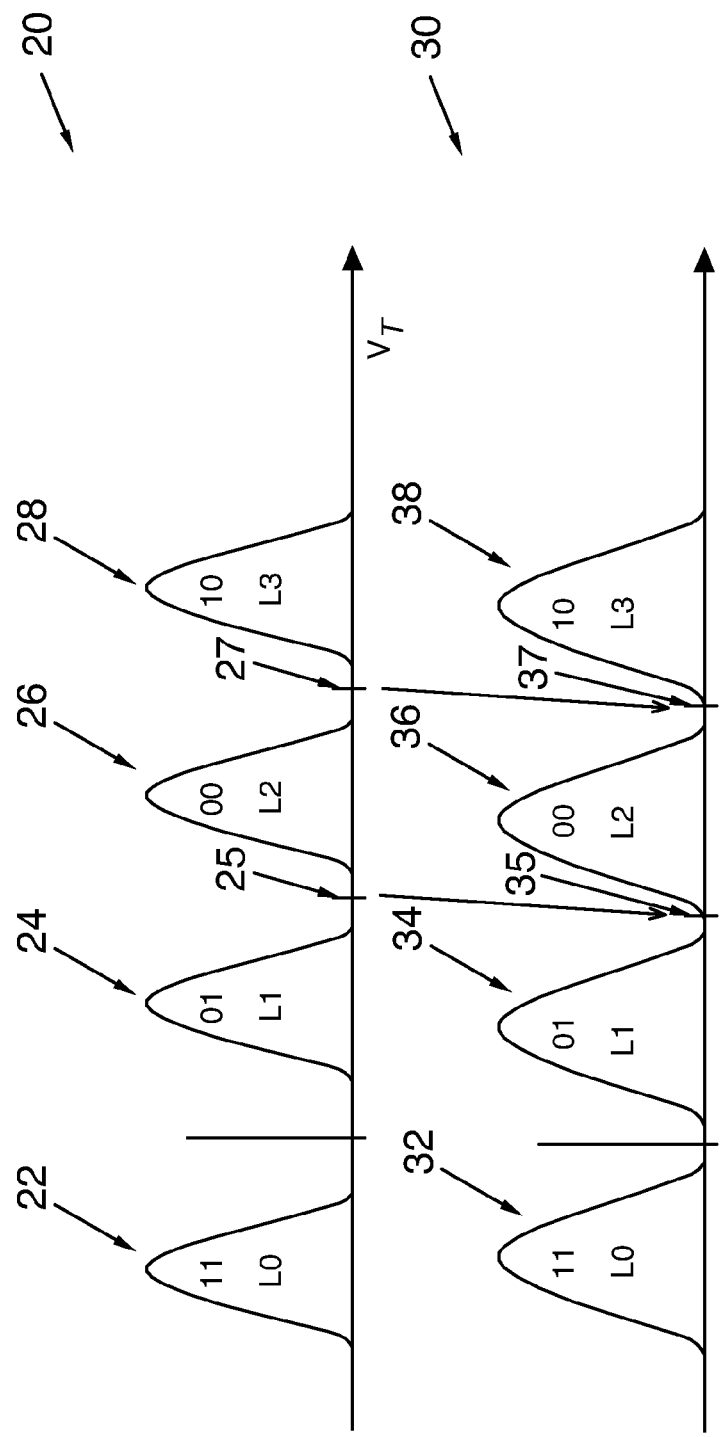
FIG. 2 is a graph illustrating NAND flash memory cell charge distributions before and after cycling and data retention.

FIG. 2 graphically illustrates NAND flash memory cell charge default distributions 20 and NAND flash memory cell charge distributions 30 after cycling and data retention. The distributions 20 include: distribution 22 for bit value 11; distribution 24 for bit value 01; distribution 26 for bit value 00; distribution 28 for bit value 10. Also shown in FIG. 2 are distributions 30 after cycling and data retention in the NAND flash memory. The distributions 30 include: distribution 32 for bit value 11; distribution 34 for bit value 01; distribution 36 for bit value 00; distribution 38 for bit value 10. Read re-try pre-set options 25 and 27 are also shown in the default graph, as well as the corresponding values 35 and 37 after cycling and data distribution. The read re-try values 35 and 37, after cycling and data retention, may need to be adjusted downward, compared to the default values 25 and 27, to account for the shifts in the amount of charge stored on the floating gate of the NAND flash memory cell and to reduce read errors. Embodiments of the present disclosure relate to the selection of read values and the optimization thereof.

Figure 3:
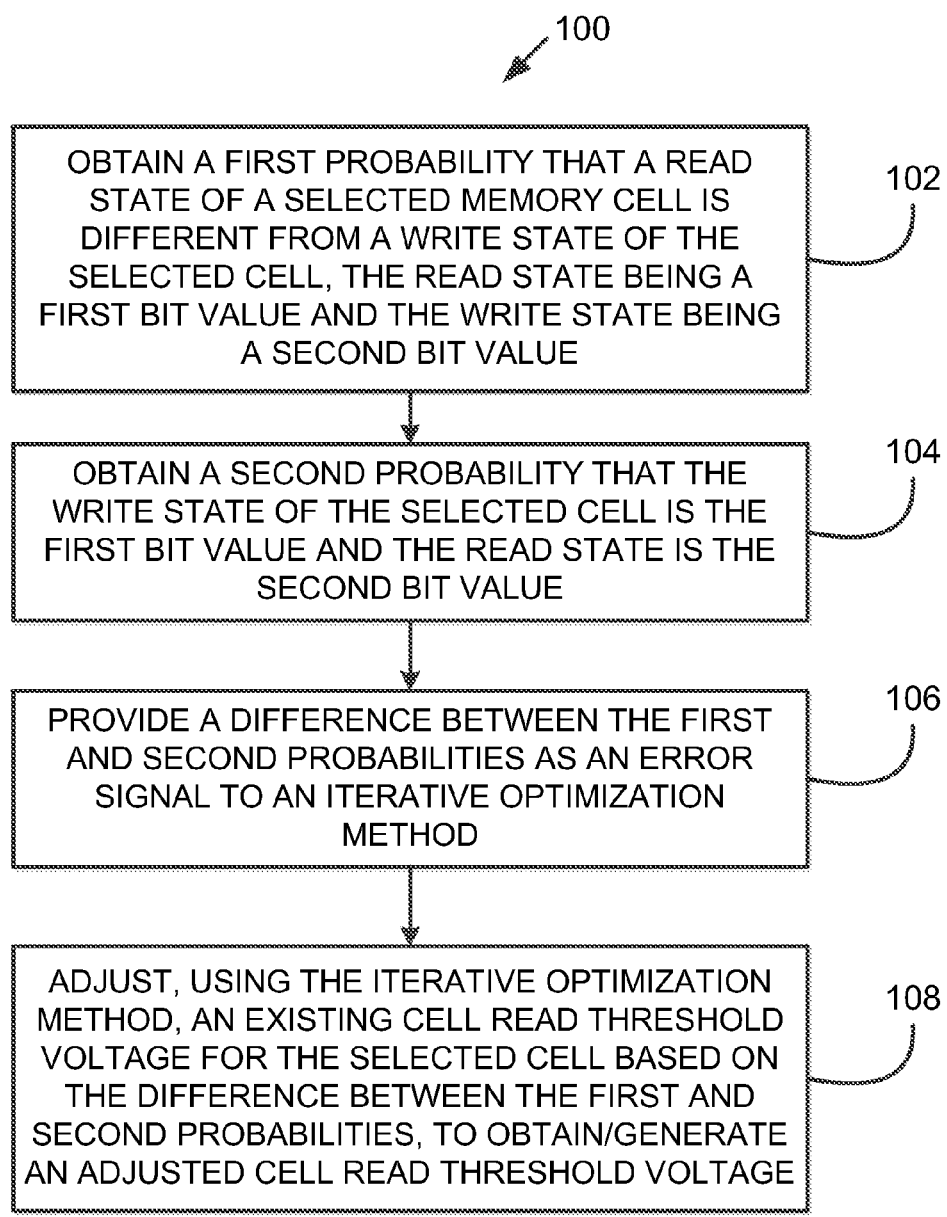
FIG. 3 is a flowchart illustrating a method for adjusting a threshold voltage for a NAND flash memory having a plurality of cells according to an embodiment of the present disclosure.

FIG. 3 illustrates a method 100 for adjusting a threshold voltage for a NAND flash memory having a plurality of cells according to an embodiment of the present disclosure. In an example embodiment, steps of the method are carried out by a NAND flash memory controller, or another processor in communication with the NAND flash memory.

At 102, the NAND flash memory controller obtains a first probability that a read state of a selected cell in the plurality of cells is different from a write state of the selected cell. The read state is a first bit value, and the write state is a second bit value, different from the first bit value.

At 104, the NAND flash memory controller obtains a second probability that the write state of the selected cell is the first bit value and the read state is the second bit value. While the first probability relates to whether the read and write states are different, the second probability relates to a relationship between the read and write states. For example, when the first probability is that read state is 0 and the write state is 1, the second probability is the probability that the read state is 1 and the write state is 0, for the same cell.

At 106, the NAND flash memory controller provides an error signal to an iterative optimization method, the error signal comprising a difference between the first and second probabilities as. In an embodiment, the error signal is provided as an input to the iterative optimization method. In an example embodiment, the iterative optimization method comprises a stochastic gradient descent method. In other example embodiments, the iterative optimization method comprises a convergent method, or lattice adaptive filters.

In an example embodiment, the iterative optimization method is configured to cooperate with an offset read function already available as a feature of the NAND controller. For example, NAND vendors provide very simple command sequences that the controller can use to implement a read with a Vt offset. In an embodiment, the controller takes advantage of these atomic simple commands and incorporates them into a more complex system to perform the Vt optimization.

At 108, the NAND flash memory controller adjusts, using the iterative optimization method, an existing cell read threshold voltage for the selected cell based on the difference between the first and second probabilities, to obtain or generate an adjusted cell read threshold voltage. For example, adjusting the cell read threshold voltage can include generating the adjusted cell read threshold voltage for the selected cell based on the difference between the first and second probabilities and on the existing cell read threshold voltage. In an embodiment in which the iterative optimization method comprises a stochastic gradient descent method, 108 comprises adding, to the existing read threshold voltage, the difference between the first and second probabilities multiplied by a gain.

In an example embodiment in which the iterative optimization method comprises a stochastic gradient descent method, the stochastic gradient method's output is the next $V_t$ offset value that should be tried. Starting with a first $V_t$ value, the optimization method provides a second $V_t$ value to try; the iterations continue until either the $V_t$ value no longer changes or another stopping criteria is met.

In an example embodiment, the method further comprises: determining, at the NAND flash memory controller and using an error correction code, the first probability, or the second probability, or both. For example, the ECC circuit can generate a signal that is used in the firmware of the controller to generate these probabilities. In an example embodiment in which the selected cell is a multi-level cell having at least two cell read threshold voltages, the method further comprises repeating steps 102-108 for each cell read threshold voltage of the selected multi-level cell.

In an example embodiment, adjustments are made for each cell in the NAND flash memory. For example, the method can include repeating 102-108 for each cell in the plurality of cells of the NAND flash memory. In an example embodiment, the method further comprises concurrently generating the adjusted cell read threshold voltages for a set of selected cells in the plurality of cells. In an example embodiment, in 106 for each cell in the plurality of cells, the difference between the first and second probabilities comprises an average of the first and second probabilities.

In another aspect, the present disclosure provides a controller-implemented method for adjusting a threshold voltage for a NAND flash memory having a plurality of cells, the method comprising: a) obtaining, at a NAND controller, a first error rate representing when a read state of a selected cell in the plurality of cells is different from a write state of the selected cell, the read state being a first bit value and the write state being a second bit value; b) obtaining, at the NAND controller, a second error rate representing when the write state of the selected cell being the first bit value and the read state being the second bit value; c) providing, at the NAND controller, an error signal to an iterative optimization method, the error signal comprising a difference between the first and second error rates; and d) adjusting, at the NAND controller and using the iterative optimization method, an existing cell read threshold voltage for the selected cell such that the first error rate equals the second error rate. In an example embodiment, the method further comprises: determining, at the NAND flash memory controller and using an error correction code, the first error rate, or the second error rate, or both.

Embodiments of the present disclosure introduce a voltage transition matrix, or $V_t$ transition matrix, which captures the probability of the read state of a cell differing from the write state. The $V_t$ transition matrix can be defined as a N×N matrix where N is the number of states in a flash memory cell. For the two (2) state SLC example of FIG. 4, the $V_t$ transition matrix is a 2×2 matrix. For the four (4) state MLC-2 example of FIG. 5, the $V_t$ transition matrix is a 4×4 matrix. For an eight (8) state TLC, the $V_t$ transition matrix is a 2×2 matrix.

The $V_t$ transition matrix defines the probability of the cell being read as one of the N states given that it was written as one of the N states. Each error value is represented generally by $e_{ij}$. In an ideal NAND flash memory, all the $e_{ij}$ values would be 0. However, in reality this is not the case, and the magnitude of the different $e_{ij}$ values provides an indication about the state of the NAND flash memory and of the optimality of the read thresholds inside the NAND flash memory.

As an example, if it is observed that $e_{ij} \ll e_{ji}$ for any values i and j, then this is an indication that the threshold voltage between the levels i and j may not be optimal. This imbalance can then be used as an error signal for an optimization method, such as stochastic gradient.

Figure 4:
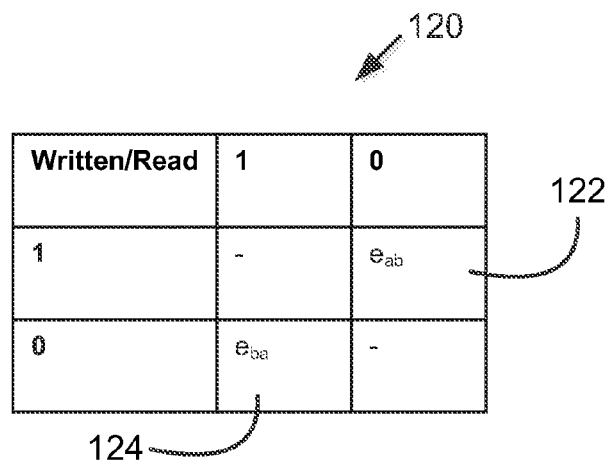
FIG. 4 illustrates an offset voltage transition matrix for a single level cell flash according to an embodiment of the present disclosure.

FIG. 4 illustrates an offset voltage transition matrix 120 for a single level cell NAND flash memory according to an embodiment of the present disclosure. In an example embodiment, non-errors are omitted, such that the main diagonal of the matrix is NULL. Such a matrix provides information about the optimality of the read levels inside the NAND flash memory read circuitry.

In the $V_t$ transition matrix 120 of FIG. 4, the error $e_{ab}$ 122 indicates the number of errors detected where bit value 1 was written, but bit value 0 was read. Similarly, the error $e_{ba}$ 124 indicates the number of errors detected where bit value 0 was written, but bit value 1 was read.

An example of how the terms in the $V_t$ transition matrix are employed is as follows:

$$V_{ab}(k+1)=V_{ab}(k)+g^*E_{ab}(k) \quad \text{Equation 1}$$

where $E_{ab}(k)=E_{ab}-E_{ba}$ $V_{ab}(k+1)$ is the new offset read voltage value;

$V_{ab}(k)$ is the old offset read voltage value;

g is a gain which can vary over time, as the flash ages, and can be pre-determined during flash device characterization;

$E_{ab}$ is the number of errors detected where bit value a was written but bit value b was read; and $E_{ba}$ is the number of errors detected where bit value b was written but bit value a was read.

In the example $V_t$ transition matrix 120 of FIG. 4, there are only two possible voltage values, and therefore there is only one offset read voltage value, or threshold, to be adjusted. Such adjustment is performed in relation to a method according to an embodiment of the present disclosure based on steps 102-108 as shown in FIG. 3.

Figure 5:
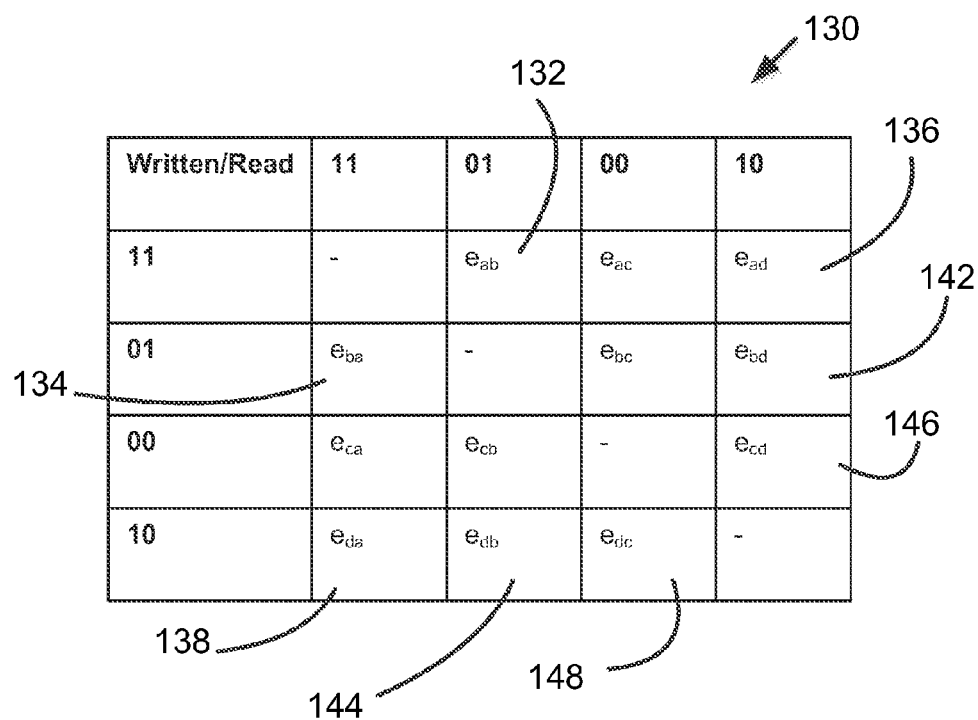
FIG. 5 illustrates an offset voltage transition matrix for a multi-level cell (MLC-2) flash according to an embodiment of the present disclosure.

FIG. 5 illustrates an offset voltage transition matrix for a multi-level cell (MLC-2) NAND flash memory according to an embodiment of the present disclosure. For the purposes of the present example, the main diagonal of the offset voltage transition matrix is ignored, as the main diagonal does not contain errors.

In the $V_t$ transition matrix 130 of FIG. 5, the error $e_{ab}$ 132 indicates the number of errors detected where bit value 11 was written, but bit value 01 was read. Similarly, the error $e_{ba}$ 134 indicates the number of errors detected where bit value 01 was written, but bit value 11 was read. The error $e_{ad}$ 136 indicates the number of errors detected where bit value 10 was written, but bit value 11 was read. Similarly, the error $e_{da}$ 138 indicates the number of errors detected where bit value 11 was written, but bit value 10 was read. Errors 132 and 134 can be considered an error value pair, as can errors 136 and 138.

Since the matrix shown in FIG. 5 is for an MLC-2 NAND flash memory, there are multiple pairs of error values, with a first error value in the pair indicating a number of errors when a first value is written and a second value is read, and a second error value in the pair indicating a number of errors when the second value is written and the first value is read. As shown in FIG. 5, the error $e_{bd}$ 142 indicates a number of errors detected where bit value 01 was written, but bit value 10 was read. Similarly, the error $e_{db}$ 144 indicates a number of errors detected where bit value 10 was written, but bit value 01 was read. The error $e_{cd}$ 146 indicates a number of errors detected where bit value 00 was written, but bit value 10 was read. Similarly, the error $e_{dc}$ 148 indicates a number of errors detected where bit value 10 was written, but bit value 00 was read.

In the example MLC-2 NAND flash memory embodiment described in relation to the $V_t$ transition matrix 130 of FIG. 5, there are four possible voltage values, and therefore there are three different offset read voltage values, or thresholds, to be adjusted. Such adjustment is performed in relation to a method according to an embodiment of the present disclosure based on steps 102-108 as shown in FIG. 3, for each offset read voltage value.

In an example embodiment, the present disclosure provides for detecting and subtracting corresponding bit errors in all adjacent charge ranges of a multi-level cell NAND flash memory, and adjusting all offset read voltages, or read-levels, of the NAND flash memory according to the results of the subtraction.

In a method according to an example embodiment, with respect to the generation of the $V_t$ transition matrix, steps 102 and 104 are repeated for each cell in the plurality of cells, and a voltage transition matrix is generated comprising the average of the first and second probabilities for each cell in the plurality of cells.

Figure 6:
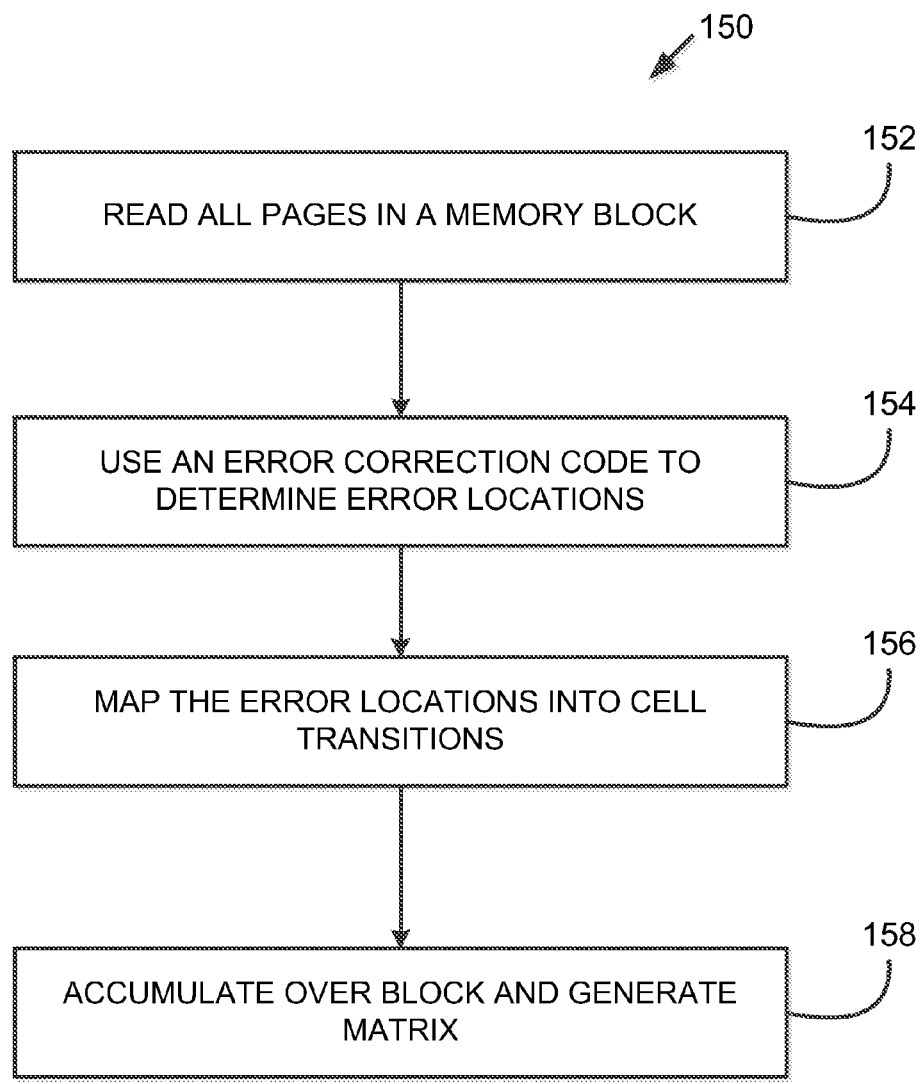
FIG. 6 is a flowchart illustrating a method for generating an offset voltage transition matrix according to an embodiment of the present disclosure.

FIG. 6 illustrates a method 150 for generating an offset voltage transition matrix according to an embodiment of the present disclosure. The example embodiment of FIG. 6 includes: reading (152), at the NAND flash memory controller, all pages in a block of the NAND flash memory; using (154) an error correction code (ECC) at the NAND flash memory controller to determine error locations upon which the first and second probabilities are based; mapping (156), at the NAND flash memory controller, the error locations with respect to cell read threshold voltages; and accumulating (158), at the NAND flash memory controller, the error locations with respect to the cell read threshold voltages over the block and generating a voltage transition matrix. One of ordinary skill in the art would understand that other methodologies to construct this matrix exist.

Embodiments of the present disclosure apply optimization methods, such as stochastic gradient and filter optimization methods, to the setting of threshold voltages inside a NAND flash. As such, the raw bit error rate of the flash can be minimized, and useful soft information is provided for advanced error correction schemes such as LDPC codes. Embodiments of the present disclosure build on the very well understood concept of iterative optimization methods. For example, embodiments of the present disclosure benefit from the well understood properties of the stochastic gradient method with respect to stability and convergence.

Embodiments of the present disclosure provide one or more of the following advantages: minimizing RBER (which maximizes flash life), to meet performance requirements for SSD controllers; minimizing reads from the flash, to achieve good latency performance; and maximizing SSD lifetimes and reducing cost per user GB, good ECC techniques.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A controller-implemented method for adjusting a threshold voltage for a NAND flash memory having a plurality of cells, the method comprising:

a) obtaining, at a NAND flash memory controller, a first probability that a read state of a selected cell in the plurality of cells is different from a write state of the selected cell, the read state being a first bit value and the write state being a second bit value;

b) obtaining, at the NAND flash memory controller, a second probability that the write state of the selected cell is the first bit value and the read state is the second bit value;

c) providing, at the NAND flash memory controller, an error signal to an iterative optimization method, the error signal comprising a difference between the first and second probabilities; and d) adjusting, at the NAND flash memory controller and using the iterative optimization method, a cell read threshold voltage for the selected cell based on the difference between the first and second probabilities, to generate an adjusted cell read threshold voltage, the method further comprising:

reading, at the NAND flash memory controller, all pages in a block of the NAND flash memory;

using an error correction code (ECC) at the NAND flash memory controller to determine error locations upon which the first and second probabilities are based;

mapping, at the NAND flash memory controller, the error locations with respect to cell read threshold voltages; and accumulating, at the NAND flash memory controller, the error locations with respect to the cell read threshold voltages over the block and generating a voltage transition matrix.

2. The method of claim 1 wherein adjusting comprises adding, to the existing cell read threshold voltage, the difference between the first and second probabilities multiplied by a gain.

3. The method of claim 1 wherein the iterative optimization method utilizes a stochastic gradient descent.

4. The method of claim 3 wherein the stochastic gradient descent method generates the adjusted cell read threshold voltage.

5. The method of claim 1 wherein the iterative optimization method utilizes lattice adaptive filters.

6. The method of claim 1 further comprising: determining, at the NAND flash memory controller and using an error correction code, the first probability that the read state of the selected cell in the plurality of cells is different from the write state of the selected cell.

7. The method of claim 6 wherein an error correction code circuit generates a signal that is provided to firmware of the controller to generate the first probability.

8. The method of claim 1 further comprising: determining, at the NAND flash memory controller and using an error correction code, the second probability that the write state of the selected cell is the first bit value and the read state is the second bit value.

9. The method of claim 8 wherein an error correction code circuit generates a signal that is provided to firmware of the controller to generate the second probability.

10. The method of claim 1 wherein the iterative optimization method is configured to cooperate with an offset read function of the NAND flash memory controller to incorporate command sequences of the offset read into the iterative optimization method.

11. The method of claim 1 wherein the selected cell is a multi-level cell having at least two cell read threshold voltages, and wherein the method further comprises repeating steps a) through d) for each cell read threshold voltage of the selected multi-level cell.

12. The method of claim 1 further comprising repeating steps a) through d) for each cell in the plurality of cells of the NAND flash memory.

13. The method of claim 9 further comprising concurrently generating the adjusted cell read threshold voltages for a set of selected cells in the plurality of cells.

14. The method of claim 9 wherein, in step c) for each cell in the plurality of cells, the difference between the first and second probabilities comprises an average of the first and second probabilities.

15. The method of claim 1 further comprising:
repeating steps a) and b) for each cell in the plurality of cells; and
generating a voltage transition matrix comprising the average of the first and second probabilities for each cell in the plurality of cells.

16. A controller-implemented method for adjusting a threshold voltage for a NAND flash memory having a plurality of cells, the method comprising:

a) obtaining, at a NAND controller, a first error rate representing when a read state of a selected cell in the plurality of cells is different from a write state of the selected cell, the read state being a first bit value and the write state being a second bit value;

b) obtaining, at the NAND controller, a second error rate representing when the write state of the selected cell being the first bit value and the read state being the second bit value;

c) providing, at the NAND controller, an error signal to an iterative optimization method, the error signal comprising a difference between the first and second error rates; and d) adjusting, at the NAND controller and using the iterative optimization method, a cell read threshold voltage for the selected cell such that the first error rate equals the second error rate, the method further comprising:

reading, at the NAND flash memory controller, all pages in a block of the NAND flash memory;

using an error correction code (ECC) at the NAND flash memory controller to determine error locations upon which the first and second error rates are based;

mapping, at the NAND flash memory controller, the error locations with respect to cell read threshold voltages; and accumulating, at the NAND flash memory controller, the error locations with respect to the cell read threshold voltages over the block and generating a voltage transition matrix.

17. The method of claim 16 further comprising;
repeating steps a) and b) for each cell in the plurality of cells; and
generating a voltage transition matrix comprising the average of the first and second error rates for each cell in the plurality of cells.

18. A non-transitory computer readable memory storing statements and instructions for execution by a NAND flash memory controller to perform a method for adjusting a threshold voltage for a NAND flash memory having a plurality of cells, the method comprising:

a) obtaining, at the NAND controller, a first error rate representing when a read state of a selected cell in the plurality of cells is different from a write state of the selected cell, the read state being a first bit value and the write state being a second bit value;

b) obtaining, at the NAND controller, a second error rate representing when the write state of the selected cell being the first bit value and the read state being the second bit value;

c) providing, at the NAND controller, an error signal to an iterative optimization method, the error signal comprising a difference between the first and second error rates; and d) adjusting, at the NAND controller and using the iterative optimization method, an existing cell read threshold voltage for the selected cell such that the first error rate equals the second error rate, the method further comprising:

reading, at the NAND flash memory controller, all pages in a block of the NAND flash memory;

using an error correction (ECC) at the NAND flash memory controller to determine error locations upon which the first and second error rates are based;

mapping, at the NAND flash memory controller, the error locations with respect to cell read threshold voltages; and accumulating, at the NAND flash memory contoller, the error locations with respect to the cell read threshold voltages over the block and generating a voltage transition matrix.

\* \* \* \* \*

UNITED STATES PATENT AND TRADEMARK OFFICE
CERTIFICATE OF CORRECTION

| | | |
|---|---|---|
| PATENT NO. | : 9,224,479 B1 | Page 1 of 1 |
| APPLICATION NO. | : 14/132229 | |
| DATED | : December 29, 2015 | |
| INVENTOR(S) | : Stephen Bates et al. | |

It is certified that error appears in the above-identified patent and that said Letters Patent is hereby corrected as shown below:

Claims

Column 11, Claim 18, Line 18, after the word correction insert therefor -- code --

Column 11, Claim 18, Line 24, delete "contoller" and insert therefor -- controller --

Signed and Sealed this
Thirty-first Day of May, 2016

Michelle K. Lee
*Director of the United States Patent and Trademark Office*